(12) United States Patent
Matsuda et al.

(10) Patent No.: US 10,170,906 B2
(45) Date of Patent: Jan. 1, 2019

(54) SEMICONDUCTOR DEVICE FOR POWER SUPPLY CONTROL

(71) Applicant: MITSUMI ELECTRIC CO., LTD., Tokyo (JP)

(72) Inventors: Hiroki Matsuda, Zama (JP); Yukio Murata, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/552,080

(22) PCT Filed: Feb. 5, 2016

(86) PCT No.: PCT/JP2016/053445
§ 371 (c)(1),
(2) Date: Aug. 18, 2017

(87) PCT Pub. No.: WO2016/132930
PCT Pub. Date: Aug. 25, 2016

(65) Prior Publication Data
US 2018/0041027 A1 Feb. 8, 2018

(30) Foreign Application Priority Data

Feb. 19, 2015 (JP) .................................. 2015-030242

(51) Int. Cl.
*H02M 3/335* (2006.01)
*H02H 9/02* (2006.01)
(Continued)

(52) U.S. Cl.
CPC ........... *H02H 9/025* (2013.01); *G01R 31/025* (2013.01); *G01R 31/027* (2013.01);
(Continued)

(58) Field of Classification Search
CPC .... H02M 3/31; H02M 3/3372; H02M 3/3388; H02M 3/33507; H02M 3/33515;
(Continued)

(56) References Cited

U.S. PATENT DOCUMENTS 8,665,621 B2    3/2014 Tsai et al.
8,811,042 B2    8/2014 Fang
(Continued)

FOREIGN PATENT DOCUMENTS

JP          06062564 A     3/1994
JP       2001157446 A     6/2001
(Continued)

OTHER PUBLICATIONS

International Search Report (ISR) and Written Opinion dated May 10, 2016 issued in International Application No. PCT/JP2016/053445.

(Continued)

*Primary Examiner* — Yemane Mehari
(74) *Attorney, Agent, or Firm* — Holtz, Holtz & Volek PC

(57) ABSTRACT

A semiconductor device for power supply control includes an on/off control signal generation circuit which generates a control signal for turning on or off a switching element; a current detection terminal to which voltage in proportion to a current flowing in a primary-side winding wire of a transformer is input; a pull-up unit with high impedance provided between the current detection terminal and a terminal to which an internal power supply voltage is applied; and a terminal monitoring circuit which determines that the current detection terminal is abnormal when comparing the voltage of the current detection terminal with a predetermined voltage and detecting that the voltage of the current detection terminal is higher than the predetermined voltage. When the terminal monitoring circuit detects abnor- (Continued)

mality of the current detection terminal, a signal generation of the on/off control signal generation circuit is stopped by a signal output from the terminal monitoring circuit.

3 Claims, 5 Drawing Sheets

(51) Int. Cl.
| H02M 3/28 | (2006.01) |
| G01R 31/02 | (2006.01) |
| H02H 7/125 | (2006.01) |
| H02M 1/088 | (2006.01) |
| H02M 1/14 | (2006.01) |
| H02M 1/32 | (2007.01) |

(52) U.S. Cl.
CPC .......... *H02H 7/1257* (2013.01); *H02M 1/088* (2013.01); *H02M 1/143* (2013.01); *H02M 1/32* (2013.01); *H02M 3/28* (2013.01)

(58) Field of Classification Search
CPC ......... H02M 3/33523; H02M 3/33538; H02M 3/33546; H02M 3/33553; H02M 3/33569; H02M 3/33592; H02M 1/088; H02M 1/143; H02M 1/32; G01R 31/025; G01R 31/027; H02H 7/1257
USPC .................. 363/21.15–21.18, 22–26, 31, 139
See application file for complete search history.

(56) References Cited

U.S. PATENT DOCUMENTS

| 9,318,965 | B2* | 4/2016 | Schroeder gen Berghegger ......... H02M 3/33546 |
| 9,570,903 | B2 | 2/2017 | Fang |
| 9,583,935 | B2 | 2/2017 | Fang |
| 2012/0106205 | A1 | 5/2012 | Tsai et al. |
| 2012/0294046 | A1* | 11/2012 | Nate .................. H02M 1/4225 363/21.01 |
| 2013/0114307 | A1 | 5/2013 | Fang |
| 2013/0235622 | A1* | 9/2013 | Masuda ............ H02M 3/33507 363/21.12 |
| 2014/0126248 | A1 | 5/2014 | Fang |
| 2014/0313791 | A1 | 10/2014 | Fang |
| 2017/0170716 | A1 | 6/2017 | Fang |
| 2017/0170717 | A1 | 6/2017 | Fang |
| 2017/0366089 | A1* | 12/2017 | Matsuda ........... H02M 3/33507 |
| 2018/0019656 | A1* | 1/2018 | Matsuda ................. H02M 1/08 |
| 2018/0034373 | A1* | 2/2018 | Matsuda ................. H02M 3/28 |

FOREIGN PATENT DOCUMENTS

| JP | 2011019372 A | 1/2011 |
| JP | 2012249524 A | 12/2012 |
| JP | 2013150456 A | 8/2013 |

OTHER PUBLICATIONS

International Preliminary Report on Patentability (IPRP) dated Aug. 22, 2017 issued in counterpart International Application No. PCT/JP2016/053445.
Extended European Search Report (EESR) dated Sep. 10, 2018 issued in counterpart European Application No. 16752317.4.
Japanese Office Action (and English language translation thereof) dated Oct. 2, 2018 issued in counterpart Japanese Application No. 2015-030242.

* cited by examiner

SEMICONDUCTOR DEVICE FOR POWER SUPPLY CONTROL

TECHNICAL FIELD

The present invention relates to a semiconductor device for power supply control, and particularly to a technique effectively used for a control semiconductor device that forms an insulated direct-current power supply device provided with a transformer for voltage conversion.

BACKGROUND ART

Examples of direct-current power supply devices include an AC-DC converter which is structured by a diode bridge circuit that rectifies an alternating-current power supply and an insulated DC-DC converter that steps down the direct-current voltage rectified in the diode bridge circuit to convert the voltage into a direct-current voltage with a desired potential. One known example of such an AC-DC converter is a switching power supply device in which a switching element connected in series with a primary-side winding wire of a transformer for voltage conversion is turned on or off by a PWM (pulse width modulation) control method, aPFM (pulse frequency modulation) control method, or the like, to control the current flowing in the primary-side winding wire, so that the voltage induced by a secondary-side winding wire is controlled indirectly.

In some switching-control type AC-DC converters, for the control operation on the primary side, a resistor for current detection is provided in series with a switching element on a primary side and moreover a power supply control circuit (IC) is provided with a terminal to which the voltage obtained by current-voltage conversion in the resistor is input (current detection terminal). In this AC-DC converter, based on the detected current value and a feedback voltage from the secondary side, the peak current in the primary winding wire is controlled to maintain the output voltage or the output current on the secondary side constant (see Patent Literature 1).

CITATION LIST

Patent Literatures

Patent Literature 1: JP 2001-157446 A
Patent Literature 2: JP 06-62564 A

SUMMARY OF INVENTION

Problem to be Solved by Invention

Incidentally, as described above, when the current detection terminal is opened or the transformer is short-circuited in the power supply control circuit (IC) including the current detection terminal, the devices included in the power supply device may be damaged. Therefore, in this case, it is necessary to operate a protection circuit for the power supply control circuit as soon as possible to stop the switching operation.

In the suggested invention of the chopper type switching regulator (see Patent Literature 2), a circuit for detecting the voltage between the terminals of the current detection resistor is provided and upon the detection that the voltage between both terminals has become 0 V, the output of a reference voltage generation circuit is decreased, so that the operation of the switching control circuit is stopped.

However, the invention disclosed in Patent Literature 2 is the invention of not the AC-DC converter but the switching regulator (DC-DC converter), and the target is different from that of the present invention. The invention disclosed in Patent Literature 2 is related to the protection function in the case where the terminals of the current detection resistor are short-circuited, and does not disclose the stop operation when the current detection terminal is opened or the transformer is short-circuited. Therefore, in the occurrence of such abnormalities, it is impossible to avoid the damage on the devices included in the power supply device by operating the protection circuit for the power supply control circuit to stop the switching operation as soon as possible.

The present invention has been made in view of the above circumstances, and an object is to provide a semiconductor device for power supply control that can safely stop a power supply device if a current detection terminal is opened or a transformer is short-circuited.

Solution to Problem

In order to achieve the above object, there is provided a semiconductor device for power supply control according to the invention, that generates and outputs a driving pulse for controlling turning on or off of a switching element which supplies intermittently current to a primary-side winding wire of a transformer for voltage conversion, by inputting voltage in proportion to current flowing in the primary-side winding wire of the transformer and an output voltage detection signal from a secondary side of the transformer, the semiconductor device including:

an on/off control signal generation circuit which generates a control signal for controlling turning on or off of the switching element;

a current detection terminal to which voltage in proportion to the current flowing in the primary-side winding wire of the transformer is input;

a pull-up means with high impedance, which is provided between the current detection terminal and a terminal to which an internal power supply voltage or voltage in accordance with the internal power supply voltage is applied; and a terminal monitoring circuit which determines that the current detection terminal is abnormal when comparing the voltage of the current detection terminal with a predetermined voltage and detecting that the voltage of the current detection terminal is higher than the predetermined voltage, wherein when the terminal monitoring circuit has detected an abnormality of the current detection terminal, a signal generation operation of the on/off control signal generation circuit is stopped by a signal output from the terminal monitoring circuit.

By the structure described above, in the case where a predetermined amount of current or more flows in the primary-side winding wire of the transformer because the current detection terminal is opened or the transformer is short-circuited, the operation of the signal generation circuit to generate the signal for turning on or off the switching element is stopped to prevent current from flowing in the primary-side winding wire of the transformer. Therefore, the power supply device can be stopped safely.

It is preferred that the semiconductor device for power supply control includes:

a first power supply terminal to which voltage of AC input is input;

a second power supply terminal to which voltage obtained by rectifying and smoothing voltage induced by an auxiliary winding wire of the transformer is input;

a switching means which is provided between the first power supply terminal and the second power supply terminal;

a starting circuit which controls turning on or off of the switching means on the basis of voltage of the second power supply terminal so that the voltage of the second power supply terminal is controlled to be in a predetermined first voltage range;

a state control circuit which controls turning on or off of the switching means on the basis of the voltage of the second power supply terminal so that the voltage of the second power supply terminal is controlled to be in a predetermined second voltage range narrower than the first voltage range, wherein when the terminal monitoring circuit has detected the abnormality of the current detection terminal, the state control circuit is set to an operation state by the signal output from the terminal monitoring circuit.

Thus, in the case where the current detection terminal is opened or the transformer is short-circuited, the state control circuit (a latch stop control circuit) that performs control so that the voltage of the second power supply terminal (VDD) is in the range of the second voltage range (for example, 12 V to 13 V) is operated. Therefore, the following irrational operation state can be prevented: the operation of the signal generation circuit (a driver) is stopped, the voltage in the auxiliary winding wire is decreased, and a starting circuit (a start-up circuit) is operated to restart the semiconductor device for power supply control, so that the state returns to the state before the opening of the current detection terminal is detected and this operation is repeated. As a result, the stop state of the power supply device can be maintained without restarting the semiconductor device for power supply control.

It is preferred that the semiconductor device for power supply control includes:

an external input terminal to which an output voltage detection signal is input from the secondary side of the transformer; and an abnormality detection circuit which monitors a state of the current detection terminal and the external input terminal and detects an abnormal state, wherein when the abnormality detection circuit has detected the abnormality of the current detection terminal, by the signal output from the abnormality detection circuit, the signal generation operation of the on/off control signal generation circuit is stopped and the state control circuit is set to the operation state.

Thus, even if a short-circuit is generated between the current detection terminal and the ground point or the resistor for current detection is short-circuited, the operation of the signal generation circuit to generate the signal for turning on or off the switching element is stopped, so that the power supply device can be stopped safely and the occurrence of the irrational operation by the starting circuit (start-up circuit) can be prevented.

Advantageous Effects of Invention

According to the present invention, a control semiconductor device for an insulated direct-current power supply device including a transformer for voltage conversion, that controls the output by turning on or off the current flowing in a primary-side winding wire has an effect that the power supply device can be safely stopped if a current detection terminal is opened or a transformer is short-circuited.

EMBODIMENTS FOR CARRYING OUT INVENTION

A preferred embodiment of the present invention will hereinafter be described with reference to the drawings.

Figure 1:
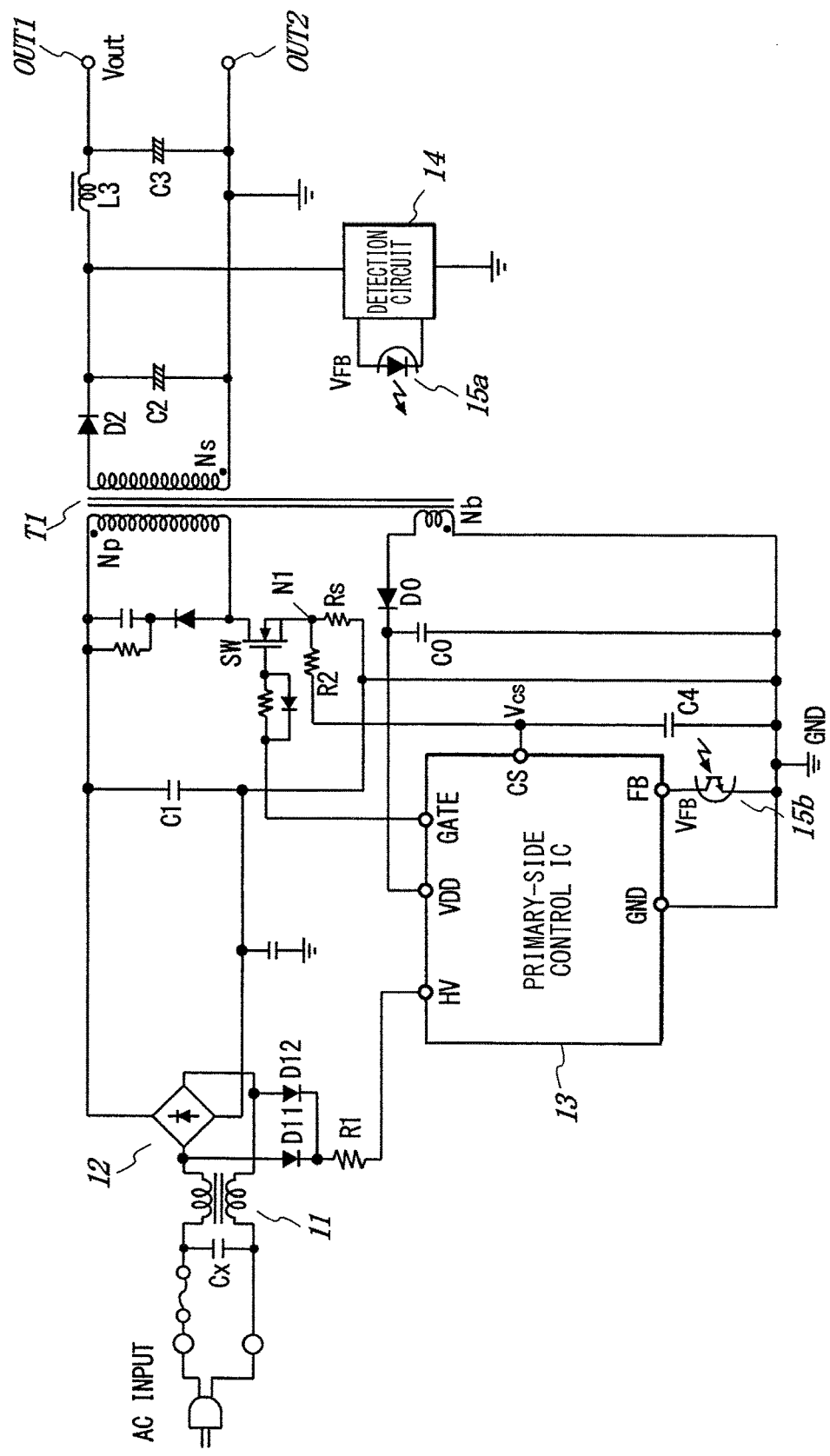
FIG. 1 is a circuit structure diagram illustrating one embodiment of an AC-DC converter corresponding to an insulated direct-current power supply device according to the present invention.

FIG. 1 is a circuit structure diagram illustrating one embodiment of an AC-DC converter corresponding to an insulated direct-current power supply device to which the present invention has been applied.

The AC-DC converter according to this embodiment includes: an X condenser Cx connected between AC input terminals for attenuating the normal-mode noise; a noise blocking filter 11 including a common-mode coil and the like; a diode bridge circuit 12 that rectifies alternating-current voltage (AC); a smoothing condenser C1 that smooths the rectified voltage; a transformer T1 for voltage conversion including a primary-side winding wire Np, a secondary-side winding wire Ns, and an auxiliary winding wire Nb; a switching transistor SW including an N-channel MOSFET connected in series with the primary-side winding wire Np of this transformer T1; and a power supply control circuit 13 that drives the switching transistor SW. In this embodiment, the power supply control circuit 13 is formed as a semiconductor integrated circuit (hereinafter referred to as a power supply control IC) on one semiconductor chip formed of single-crystal silicon or the like.

On the secondary side of the transformer T1, a rectifying diode D2 connected in series with the secondary-side winding wire Ns and a smoothing condenser C2 connected between a cathode terminal of this diode D2 and the other terminal of the secondary-side winding wire Ns are provided. By supplying current intermittently to the primary-side winding wire Np, the alternating-current voltage is induced by the secondary-side winding wire Ns, and by rectifying and smoothing this induced alternating-current voltage, the direct-current voltage Vout in accordance with the winding wire ratio between the primary-side winding wire Np and the secondary-side winding wire Ns is output.

In addition, a coil L3 and a condenser C3 are provided on the secondary side of the transformer T1. The coil L3 and the condenser C3 form a filter for blocking the switching ripple noise and the like occurring in the switching operation on the primary side. Moreover, on the secondary side of the transformer T1, a detection circuit 14 for detecting the output voltage Vout and a photodiode 15a as an emission-side element of a photocoupler are provided. The photodiode 15a is connected to the detection circuit 14 and transmits a signal in accordance with the detected voltage to the power supply control IC 13. Then, on the primary side, a phototransistor 15b is provided as a light-reception-side element. The phototransistor 15b is connected between a ground point and a feedback terminal FB of the power supply control IC 13 and receives a signal from the detection circuit 14.

On the primary side of the AC-DC converter according to this embodiment, a rectifying/smoothing circuit is provided. The rectifying/smoothing circuit includes a rectifying diode D0 connected in series with the auxiliary winding wire Nb, and a smoothing condenser C0 connected between the ground point GND and a cathode terminal of the diode D0. The voltage rectified and smoothed in the rectifying/smoothing circuit is applied to a power supply voltage terminal VDD of the power supply control IC 13.

On the other hand, the power supply control IC 13 includes a high-voltage input start terminal HV to which the voltage before being rectified in the diode bridge circuit 12 is applied through diodes D11 and D12 and a resistor R1, and is configured to operate based on the voltage from this high-voltage input start terminal HV when the power is input (just after a plug is inserted).

In addition, in the present embodiment, a resistor Rs for current detection is connected between the ground point GND and the source terminal of the switching transistor SW, and moreover a resistor R2 is connected between a current detection terminal CS of the power supply control IC 13 and a node N1 between the switching transistor SW and the current detection resistor Rs. Furthermore, a condenser C4 is connected between the ground point and the current detection terminal CS of the power supply control IC 13. The resistor R2 and the condenser C4 form a low-pass filter.

Figure 2:
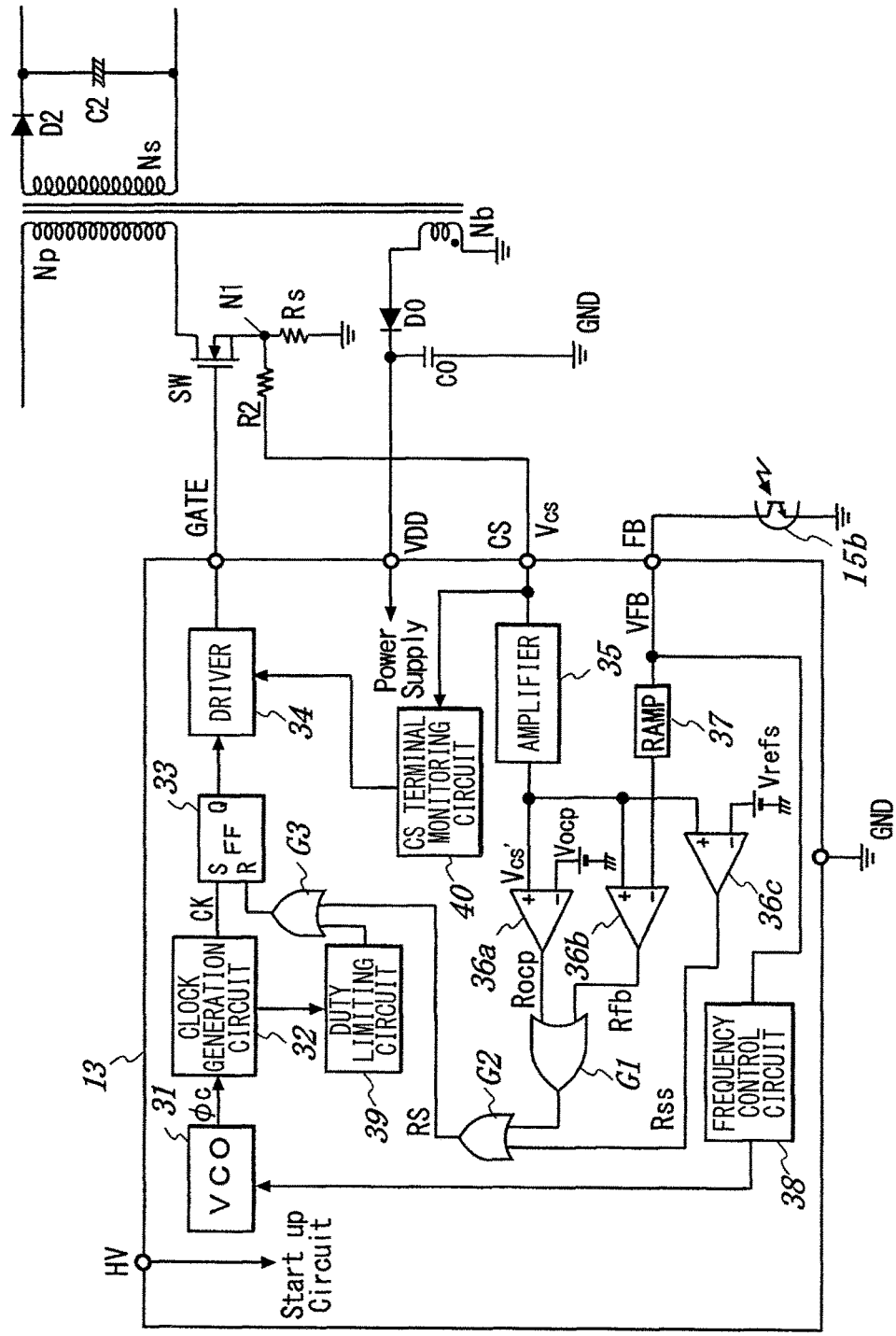
FIG. 2 is a block diagram illustrating a structure example of a primary-side switching power supply control circuit (power supply control IC) of a transformer in the AC-DC converter in FIG. 1.

Next, with reference to FIG. 2, a specific structure example of the power supply control IC 13 is described.

As illustrated in FIG. 2, the power supply control IC 13 according to this example includes: an oscillation circuit 31 that oscillates at the frequency in accordance with the voltage VFB of the feedback terminal FB; a clock generation circuit 32 including a circuit like a one-shot pulse generation circuit that generates a clock signal CK for providing the timing to turn on the primary-side switching transistor SW on the basis of an oscillation signal φc generated in the oscillation circuit 31; an RS/flip-flop 33 that is set by the clock signal CK; and a driver (a driving circuit) 34 that generates a driving pulse GATE of the switching transistor SW in accordance with the output of the flip-flop 33.

Figure 3:
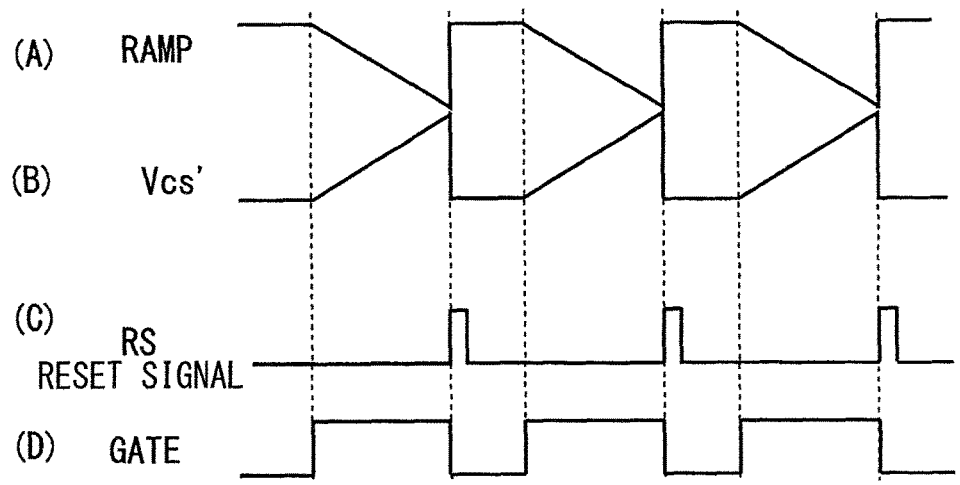
FIG. 3 shows waveform diagrams illustrating the change of voltage in each part of a power supply control IC in an example.

Moreover, the power supply control IC 13 includes: an amplifier 35 that amplifies the voltage Vcs input to the current detection terminal CS; a comparator 36a as a voltage comparison circuit that compares the voltage Vcs' amplified by the amplifier 35 with a comparison voltage (threshold voltage) Vocp for monitoring the over-current state; a waveform generation circuit 37 that generates a voltage RAMP having a predetermined waveform as illustrated in FIG. 3(A) on the basis of the voltage VFB of the feedback terminal FB; a comparator 36b that compares a potential Vcs' having a waveform as illustrated in FIG. 3(B) that is amplified by the amplifier 35 with a waveform RAMP generated by the waveform generation circuit 37; and an OR gate G1 that implements the OR operation of the outputs of the comparators 36a and 36b. In the power supply control IC 13 according to the present example, the voltage RAMP in FIG. 3(A) is generated so as to decrease from the feedback voltage VFB with a constant inclination.

In addition, the power supply control IC 13 according to the present example includes: a comparator 36c as a soft start circuit and an OR gate G2 that implements the OR operation of the outputs of the comparator 36c and the OR gate G1. The output of the amplifier 35 that amplifies the voltage of the current detection terminal CS is monitored, and at the time when the power is input, at which the significant voltage VFB or Vcs is not generated in the feedback terminal FE or the current detection terminal CS, the comparator 36c generates a signal Rss for resetting the flip-flop 33 so that the primary-side current is increased gradually to prevent the excess current from flowing in the primary-side winding wire.

In this structure, when the output RS of the OR gate G2 (see FIG. 3(C)) is input to the reset terminal of the flip-flop 33 through the OR gate G3, the timing to turn off the switching transistor SW is provided. Note that a pull-up resistor or a constant-current source is provided between the feedback terminal FB and an internal power supply voltage terminal, and the current flowing in the phototransistor 15b is converted into voltage by the resistor. The waveform generation circuit 37 is provided in order to deal with the sub-harmonic oscillation, and another structure may alternatively be employed in which the voltage VFB is input to the comparator 36b directly or after being level-shifted.

Figure 4:
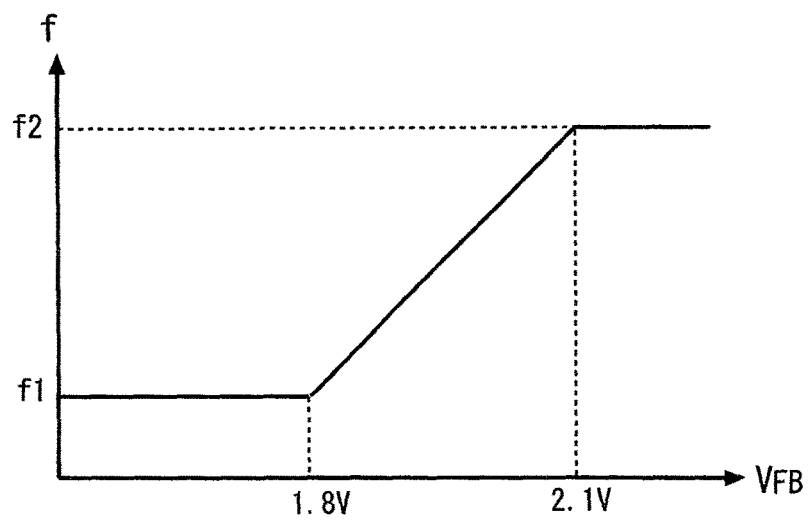
FIG. 4 is a characteristic diagram illustrating the relation between feedback voltage VFB and switching frequency in the power supply control IC in the example.

Furthermore, the power supply control IC 13 according to the present example includes a frequency control circuit 38 that changes the oscillation frequency, that is, the switching frequency of the oscillation circuit 31 on the basis of the voltage VFB of the feedback terminal FB in accordance with the characteristic as illustrated in FIG. 4. The frequency f1 in FIG. 4 is set to a value of, for example, 22 kHz and the frequency f2 is set to an arbitrary value in the range of, for example, 66 kHz to 100 kHz. The frequency control circuit 38 may be formed of a buffer such as a voltage follower and a clamp circuit When the voltage of the feedback terminal FB is, for example, 1.8 V or less, the clamp circuit clamps the voltage to 1.8 V, and when the voltage is 2.2 V or more, the clamp circuit clamps the voltage thereof to 2.2 V. Although not shown in the drawings, the oscillation circuit 31 includes an oscillator which is provided with a current source that supplies current in accordance with the voltage from the frequency control circuit 38 and whose oscillation frequency changes depending on the amount of current supplied from the current source.

The power supply control IC 13 according to the present example includes a duty limiting circuit 39 that generates a maximum duty reset signal for limiting the duty (Ton/Tcycle) of the driving pulse GATE so that the duty does not exceed a prescribed maximum value (for example, 85% to 90%) on the basis of the clock signal CK output from the clock generation circuit 32. The maximum duty reset signal output from the duty limiting circuit 39 is supplied to the flip-flop 33 through the OR gate G3 and when the pulse has reached the maximum duty, the flip-flop 33 is reset at that time; thus, the switching transistor SW is turned off immediately.

Further, the power supply control IC 13 according to the present example is provided with a CS terminal monitoring circuit 40 that detects the abnormality (opening) of the CS terminal by monitoring the voltage Vcs of the current detection terminal CS. Detailed description will be made below. When this CS terminal monitoring circuit 40 has detected the abnormality (opening) of the current detection terminal CS, the output changes into the high level to stop the operation of the driver (driving circuit) 34 and the driving pulse GATE output from the driver 34 is fixed to the low level (turnoff the SW). By resetting the flip-flop 33 in front of the driver 34 and fixing the output Q to the low level instead of stopping the operation of the driver 34 by the output of the CS terminal monitoring circuit 40, the driving pulse GATE may be fixed to the low level.

Figure 5:
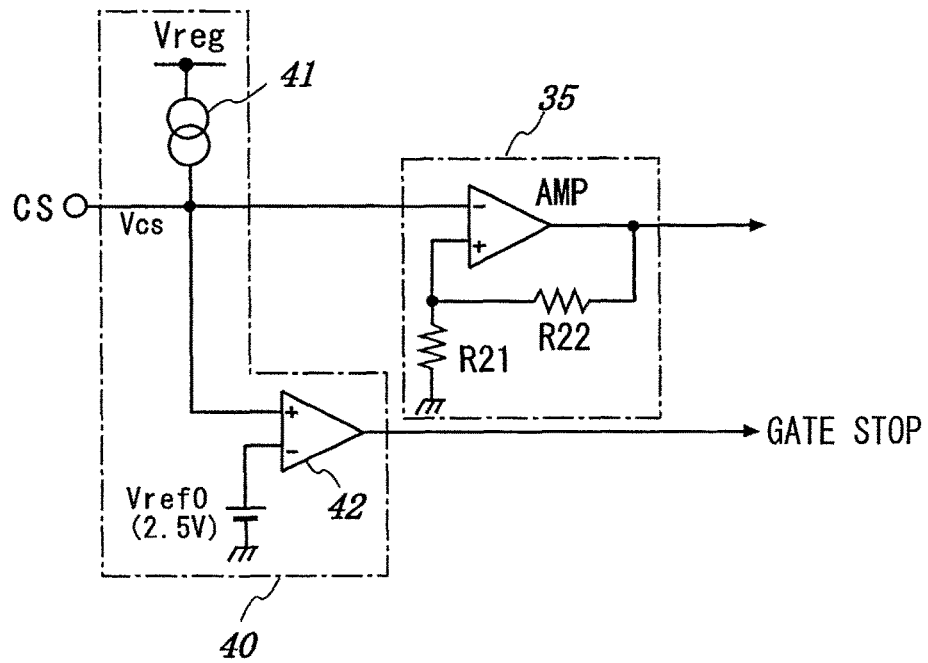
FIG. 5 is a circuit structure diagram illustrating a structure example of a CS terminal monitoring circuit in the power supply control IC in the example.

FIG. 5 illustrates a structure example of the CS terminal monitoring circuit 40 included in the power supply control IC 13 according to the present embodiment.

As illustrated in FIG. 5, the CS terminal monitoring circuit 40 includes: a constant-current source 41 connected between the current detection terminal CS and a power supply line that supplies an internal power supply voltage Vreg; and a comparator 42 whose non-inversion input terminal is connected to the current detection terminal CS and whose inversion input terminal receives a detection voltage Vref0 (for example, 2.5 V). In addition, FIG. 5 also illustrates the amplifier (amplification circuit) 35 including an amplifier AMP and resistors R21 and R22, that amplifies the voltage Vcs of the current detection terminal CS at an amplification factor of, for example, 4.8 times and supplies the amplified voltage to the comparator 36a for the overcurrent detection.

Figure 7:
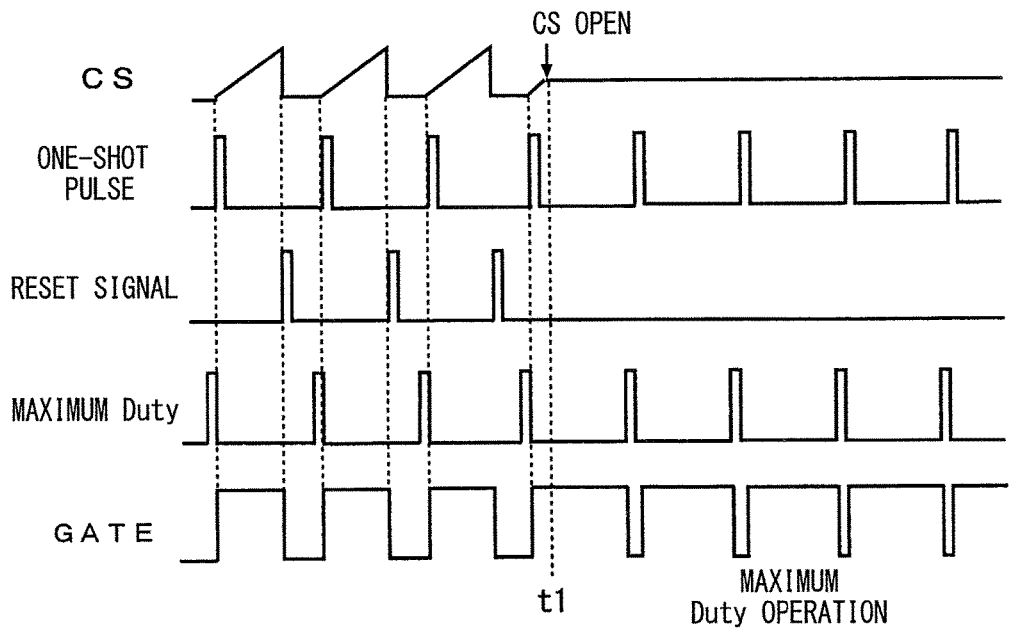
FIG. 7 is a timing chart illustrating the change of voltage in each part of a conventional power supply control IC that does not have the CS terminal monitoring circuit in the case where a current detection terminal CS is opened.

In the conventional power supply control IC without the CS terminal monitoring circuit 40, when the current detection terminal CS is opened, the voltage Vcs of the current detection terminal CS stops changing after the timing t1 at which the CS terminal is opened as indicated by an arrow in FIG. 7 (to be more correct, the charges gradually leak so that Vcs becomes closer to zero little by little). Therefore, the reset signal RS is no longer generated and the on time of the switching transistor SW becomes longer. Then, the maximum duty reset signal output from the duty limiting circuit 39 works preferentially and the driving pulse GATE of the maximum duty changes into the low level at the timing of this reset signal. Since this state is the state in which power is supplied more than the load needs, stress is applied to the power supply device and heat is generated; in some cases, the device may be destroyed.

Figure 8:
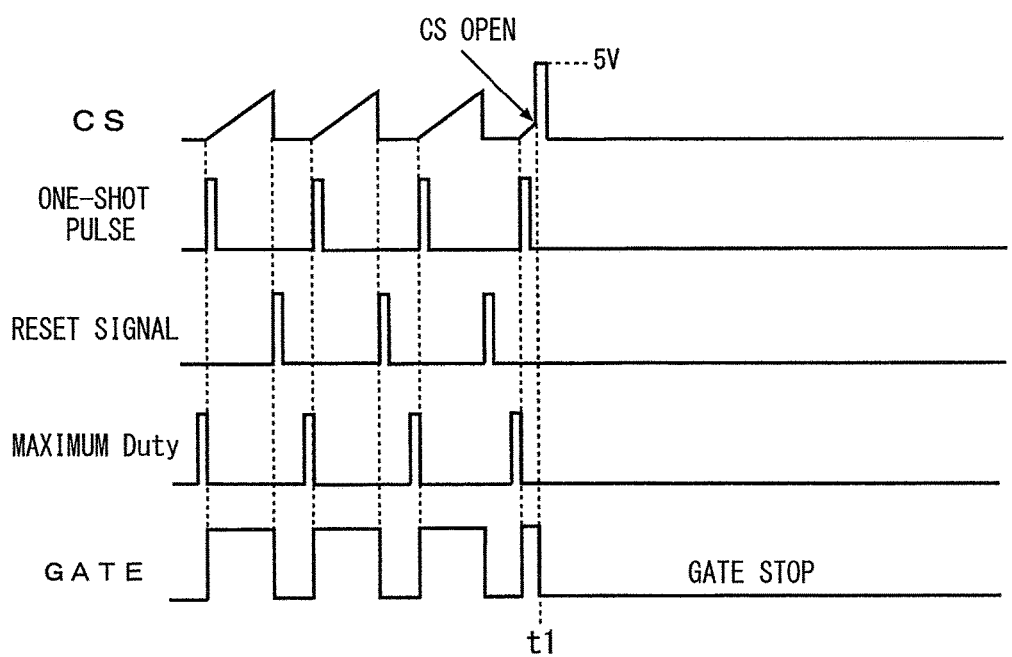
FIG. 8 is a timing chart illustrating the change of voltage in each part of a power supply control IC according to the example including a CS terminal monitoring circuit in the case where a current detection terminal CS is opened.

On the other hand, in the power supply control IC according to the present example including the CS terminal monitoring circuit 40 as illustrated in FIG. 5, when the current detection terminal CS is opened, the voltage of the current detection terminal CS is boosted to the internal power supply voltage Vreg (for example, 5 V) by the constant-current source 41 at the timing t1 where the CS terminal is opened as indicated by an arrow in FIG. 8. Therefore, the output of the comparator 42 is changed into the high level to stop the operation of the driver 34, and the output thereof, that is, the driving pulse GATE is fixed to the low level (turn off the SW). As a result, current does not flow in the primary-side winding wire of the transformer and the operation of the power supply device is stopped safely.

Note that not just in the case where the CS terminal is opened as above but also in the case where the transformer is short-circuited, when the switching transistor SW is turned on, the current that is larger than the current in the normal time flows in the primary-side winding wire. Thus, the voltage of the current detection terminal CS is increased; therefore, the output of the comparator 42 is changed into the high level to stop the operation of the driver 34, and the output thereof, that is, the driving pulse GATE is fixed to the low level (SW is turned off). As a result, the current no longer flows in the primary-side winding wire of the transformer and the operation of the power supply device is stopped safely.

Figure 6:
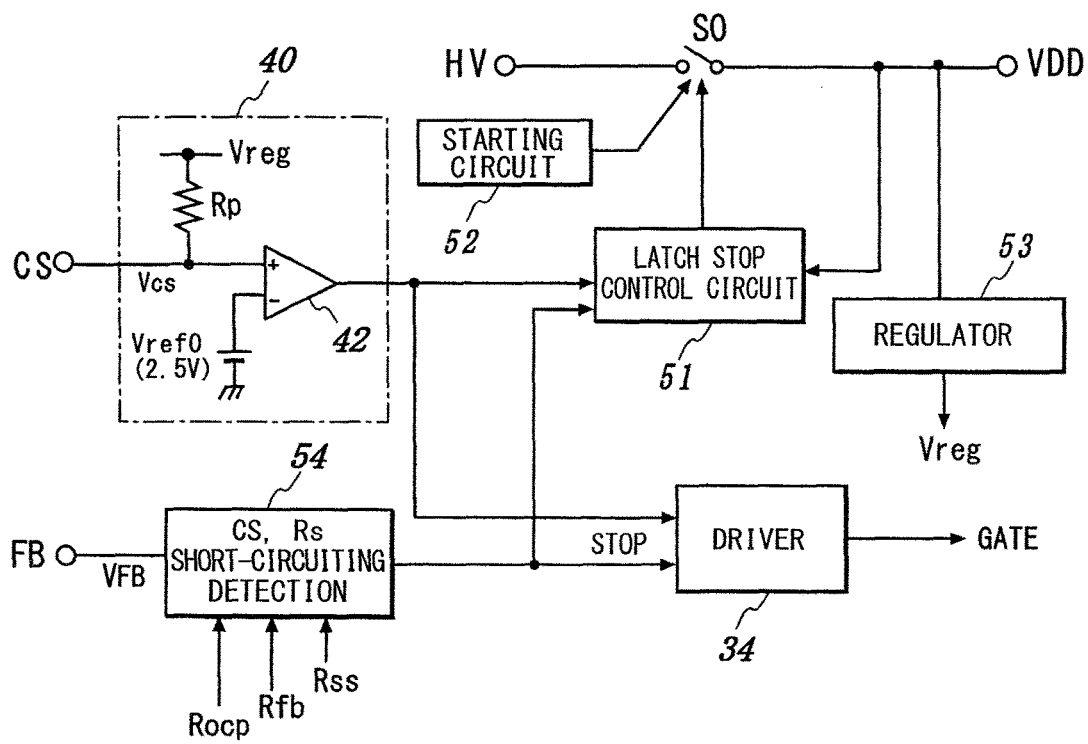
FIG. 6 is a circuit structure diagram illustrating another example of the power supply control IC including the CS terminal monitoring circuit.

Note that the constant-current source 41 can be replaced by a resistor element Rp (see FIG. 6). The constant-current source 41 and the resistor element Rp function as a pull-up means with the high impedance provided between the current detection terminal CS and the internal power supply voltage.

FIG. 6 illustrates another example of the power supply control IC having the CS terminal monitoring circuit 40.

In the example illustrated in FIG. 6, when the CS terminal monitoring circuit 40 has detected the abnormality of the current detection terminal CS (the opening of the CS terminal), the operation is stopped with the output GATE of the driver 34 set to the low level and a latch stop control circuit 51 is operated to shift the power supply control IC 13 to the latch stop mode.

As illustrated in FIG. 6, the latch stop is the function to prevent the power supply control IC 13 from restarting, by suppressing the voltage of the power supply voltage terminal VDD in the voltage range of, for example, 12 V to 13 V by turning on and off a switch S0 provided between the high-voltage input start terminal HV and the power supply voltage terminal VDD in a relatively short cycle, and the latch stop control circuit 51 is configured to perform the control operation as above by comparing the voltage of the power supply voltage terminal VDD —with the predetermined voltage (12 V, 13 V). Specifically, the switch S0 is turned on when the voltage of the power supply voltage terminal VDD is decreased to 12 V and the switch S0 is turned off when the voltage of the VDD is increased up to 13 V, and this is repeated.

Without such a latch stop function, if the CS terminal monitoring circuit 40 has detected the opening of the CS terminal and the operation of the driver 34 is stopped, the current does not flow in the auxiliary winding wire and the voltage of the power supply voltage terminal VDD is decreased but when the voltage of the power supply voltage terminal VDD has become less than or equal to an operation stop voltage value of the IC (for example, 6.5 V), a starting circuit (start-up circuit) 52 operates to turn on the switch S0 and the IC is restarted to start the switching control. Then, when the voltage of the power supply voltage terminal VDD has reached the upper-limit voltage value (for example, 21 V), the starting circuit (start-up circuit) 52 turns off the switch S0 but the state returns to the state before the opening of the CS terminal is detected because of the restarting and the driver 34 is stopped, and this operation is repeated.

In view of this, in the present example, the aforementioned irrational operation is avoided by stopping the operation of the driver 34 when the CS terminal monitoring circuit 40 has detected the opening of the CS terminal and by operating the latch stop control circuit 51 to shift the power supply control IC 13 to the latch stop mode.

The latch stop mode is canceled by pulling the plug on the AC power supply side out of the outlet.

The example illustrated in FIG. 6 includes a CS terminal short-circuiting detection circuit 54 that monitors the output Rocp of the comparator 36a for the over-current protection, the output Rfb of the comparator 36b for the feedback control, the output Rss of the comparator 36c for soft start, and the voltage VFB of the feedback terminal FB and stops the operation of the driver 34 when none of the outputs of the comparators 36a to 36c is input and the voltage of the FB terminal has become less than or equal to the predetermined voltage value.

The maximum duty reset signal output from the duty limiting circuit 39 is output for every cycle of the driving pulses and is generated continuously even if short-circuiting occurs between both terminals of the current detection resistor Rs or between the current detection terminal and the ground. On the other hand, any one of the reset signals for the output Rocp of the comparator 36a for the over-current protection, the output Rfb of the comparator 36b for the feedback control, and the output Rss of the comparator 36c for detecting the opening of the CS terminal is generated necessarily within one cycle in the normal state but if short-circuiting occurs between the current detection terminal CS and the ground or in the sensing resistor Rs, these signals are not generated.

In view of this, in the present example, the CS terminal short-circuiting detection circuit 54 as above is provided. When none of the reset signals for Rocp, Rfb, and Rss is detected and the FB terminal voltage VFB has become less than or equal to the predetermined voltage value, the operation of the driver 34 is stopped with the driving pulse GATE set to the low level and the latch stop control circuit 51 is operated.

This can prevent the current from continuing to flow in the primary-side winding wire due to the short-circuiting of the CS terminal or the sensing resistor Rs. By shifting to the latch stop mode, it is possible to prevent the following: the restarting of the power supply control IC by the starting circuit (start-up circuit) 52 triggers the restarting of the power supply device; and thus, the power supply device can remain stopped.

The invention made by the present inventor has been described in detail based on the embodiment but the present invention is not limited to the embodiment. For example, in the embodiment, the switching transistor SW that supplies current intermittently to the primary-side winding wire of the transformer is an element separated from the power supply control IC 13 but this switching transistor SW may be taken into the power supply control IC 13 to form one semiconductor integrated circuit.

INDUSTRIAL APPLICABILITY

In the description of the above embodiment, the present invention is applied to the power supply control IC that forms a flyback type AC-DC converter. However, the present invention is also applicable to a power supply control IC that forms a forward type or a quasi-resonance type AC-DC converter and moreover so-called a primary side regulation (hereinafter, PSR) type AC-DC converter that controls the output voltage on the secondary side just by the information acquired on the primary side.

REFERENCE SIGNS LIST 11 line filter
12 diode bridge circuit (rectification circuit)
13 power supply control circuit (power supply control IC)
14 secondary-side detection circuit (detection IC)
15a diode on emission side of photocoupler
15b transistor on light reception side of photocoupler
31 oscillation circuit
32 clock generation circuit
34 driver (driving circuit)
35 amplifier (non-inversion amplification circuit)
36a comparator for over-current detection (over-current detection circuit)
36b comparator for voltage/current control (voltage/current control circuit)
36c comparator for detecting the opening of the CS terminal (terminal voltage monitoring circuit)
37 waveform generation circuit
38 frequency control circuit
39 duty limiting circuit
40 CS terminal monitoring circuit
51 latch stop control circuit (state control circuit)

The invention claimed is:

1. A semiconductor device for power supply control, that generates and outputs a driving pulse for controlling turning on or off of a switching element which supplies intermittent current to a primary-side winding wire of a transformer for voltage conversion, by inputting a voltage in proportion to the current flowing in the primary-side winding wire of the transformer and an output voltage detection signal from a secondary side of the transformer, the semiconductor device comprising:
  an on/off control signal generation circuit which generates a control signal for controlling turning on or off of the switching element;
  a current detection terminal to which the voltage in proportion to the current flowing in the primary-side winding wire of the transformer is input;
  a pull-up unit comprising a current source circuit, the pull-up unit being provided between the current detection terminal and a terminal to which an internal power supply voltage or a voltage in accordance with the internal power supply voltage is applied; and
  a current detection terminal monitoring circuit which determines whether the current detection terminal is open or the transformer is short-circuited by comparing the voltage of the current detection terminal with a predetermined voltage, wherein the current detection terminal monitoring circuit determines that the current detection terminal is open or the transformer is short-circuited when detecting that the voltage of the current detection terminal is higher than the predetermined voltage,
  wherein:
  when the current detection terminal monitoring circuit has determined that the current detection terminal is open or the transformer is short-circuited, a signal generation operation of the on/off control signal generation circuit is stopped by a signal output from the current detection terminal monitoring circuit.

2. The semiconductor device for power supply control according to claim 1, further comprising:
  a first power supply terminal to which an AC voltage is input;
  a second power supply terminal to which a voltage obtained by rectifying and smoothing a voltage induced by an auxiliary winding wire of the transformer is input;
  a switching means provided between the first power supply terminal and the second power supply terminal;
  a starting circuit which controls the turning on or off of the switching means based on voltage of the second power supply terminal so that the voltage of the second power supply terminal falls in a first predetermined voltage range;

a state control circuit which controls the turning on or off of the switching means based on the voltage of the second power supply terminal so that the voltage of the second power supply terminal falls in a second predetermined voltage range narrower than the first predetermined voltage range, wherein:

when the current detection terminal monitoring circuit has determined that the current detection terminal is open or the transformer is short-circuited, the state control circuit is set to an operation state by the signal output from the current detection terminal monitoring circuit.

3. The semiconductor device for power supply control according to claim 2, further comprising:

an external input terminal to which the output voltage detection signal from the secondary side of the transformer is input;

an external input terminal voltage monitoring circuit which outputs a signal which indicates that the external input terminal is at a low level when detecting that the voltage of the external input terminal is lower than a predetermined value; and a duty limiting circuit which generates a reset signal when the driving pulse for controlling the turning on or off of the switching element reaches a predetermined maximum duty, wherein:

when the external input terminal voltage monitoring circuit has output the signal which indicates that the external input terminal is at the low level and the duty limiting circuit has detected that the driving pulse reaches the predetermined maximum duty, the signal generation operation of the on/off control signal generation circuit is stopped and the state control circuit is set to the operation state.

\* \* \* \* \*